(12) United States Patent
Lui et al.

(10) Patent No.: US 8,324,683 B2
(45) Date of Patent: *Dec. 4, 2012

(54) OXIDE TERMINATED TRENCH MOSFET WITH THREE OR FOUR MASKS

(75) Inventors: Sik Lui, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/367,916

(22) Filed: Feb. 7, 2012

(65) Prior Publication Data

US 2012/0132988 A1    May 31, 2012

Related U.S. Application Data

(63) Continuation of application No. 12/731,112, filed on Mar. 24, 2010.

(51) Int. Cl.
*H01L 29/78* (2006.01)
(52) U.S. Cl. ................... 257/334; 257/E29.262
(58) Field of Classification Search .................. 257/334, 257/E29.262
See application file for complete search history.

(56) References Cited

U.S. PATENT DOCUMENTS

| 6,069,043 A | 5/2000 | Floyd et al. |
| 2004/0056302 A1 | 3/2004 | Grebs et al. |
| 2010/0140695 A1* | 6/2010 | Yedinak et al. ............... 257/334 |
| 2011/0233666 A1 | 9/2011 | Lui et al. |

OTHER PUBLICATIONS

Office Action dated Nov. 18, 2011 in U.S. Appl. No. 12/731,112, filed Mar. 24, 2010.
Office Action dated Jun. 15, 2012 in U.S. Appl. No. 12/731,112, filed Mar. 24, 2010.

* cited by examiner

*Primary Examiner* — Calvin Lee
*Assistant Examiner* — Monica D Harrison
(74) *Attorney, Agent, or Firm* — Joshua D. Isenberg; JDI Patent

(57) ABSTRACT

An oxide termination semiconductor device may comprise a plurality of gate trenches, a gate runner, and an insulator termination trench. The gate trenches are located in an active region. Each gate trench includes a conductive gate electrode. The insulator termination trench is located in a termination region that surrounds the active region. The insulator termination trench is filled with an insulator material to form an insulator termination for the semiconductor device. The device can be made using a three-mask or four-mask process.

11 Claims, 16 Drawing Sheets

US 8,324,683 B2

OXIDE TERMINATED TRENCH MOSFET WITH THREE OR FOUR MASKS

CLAIM OF PRIORITY

This application is a continuation of and claims the priority benefit of commonly-assigned, co-pending U.S. patent application Ser. No. 12/731,112 entitled "OXIDE TERMINATED TRENCH MOSFET WITH THREE OR FOUR MASKS" to Sik Lui, filed Mar. 24, 2010, the entire disclosures of which are incorporated herein by reference.

FIELD OF THE INVENTION

This invention generally relates to trench metal oxide semiconductor field effect transistors (MOSFETS) and more particularly to oxide terminated trench MOSFETs and a method of forming such devices with three or four masks.

BACKGROUND OF THE INVENTION

A DMOS (Double diffused MOS) transistor is a type of MOSFET (Metal Oxide Semiconductor Field Effect Transistor) that uses two sequential diffusion steps aligned to the same edge to form the channel region of the transistor. DMOS transistors are often high current devices for low and high voltages, used either as discrete transistors or as components in power integrated circuits. DMOS transistors can provide high current per unit area with a low forward voltage drop.

One particular type of DMOS transistor is a so-called trench DMOS transistor in which the channel is present on the sidewall of a trench, with the gate formed in the trench, which extends from the source towards the drain. The trench gate, which is lined with a thin oxide layer and filled with polysilicon, allows less constricted current flow than a planar gate DMOS transistor structure and thereby provides lower values of specific on-resistance.

However, a conventional method of making such a trench DMOS field effect transistor requires a five to six masks process that is expensive and time consuming It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

A conventional method of making a trench MOSFET requires five or six masks. The first mask is a deep well mask, which is also used for high voltage termination. This mask is optional depending on whether the resulting device is a high-voltage device. The second mask is a trench mask, which is used to form trenches for gates and other device structures. The third mask is a body mask, which is also used for forming a termination region that protects gate oxide in the gate runner from rupture due to exposure to drain potential and shields gate pads/electrodes from the drain voltage. The fourth mask is a source mask that moves the source regions away from gate runner and termination regions to divert breakdown current away from those regions to improve unclamped inductive switching (UIS) capability. The fourth mask is also used for forming a channel stop. The fifth mask is a contact mask used for forming source/body and gate contacts and the sixth mask is a metal mask used to separate a metal layer into gate and source metal regions.

Figure 1:
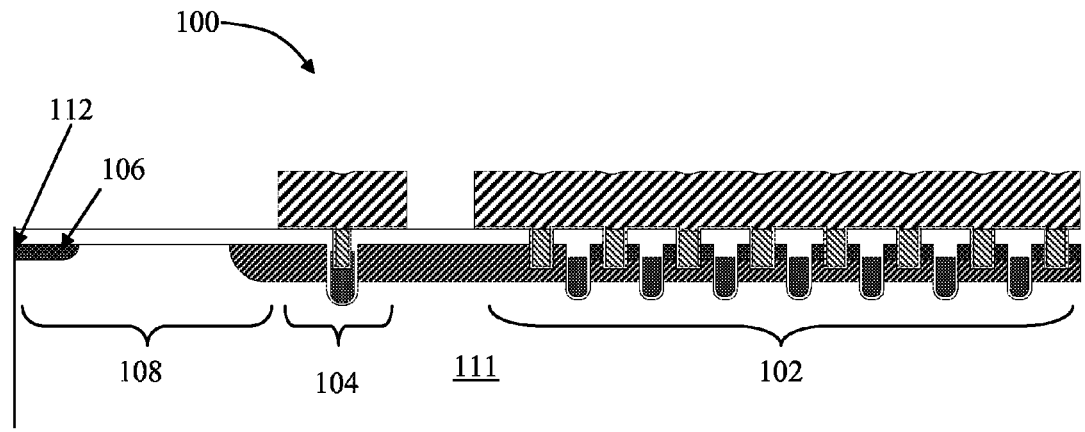
FIG. 1 is a cross-sectional view of a conventional trench MOSFET device.

FIG. 1 is a cross-sectional view of a trench MOSFET 100, which is made by the conventional six masks process as described above. As shown in FIG. 1, the trench MOSFET 100 includes active cells 102 and a gate runner 104 located in an active region. The gate runner connects to gates in the active cells 102. There is a slight risk of a p-inversion channel forming along the top surface of the N− epitaxial layer 111 towards the ends of the die. The p-inversion channel can cause leakage between source/body and drain if it reaches the die edge 112 from the junction termination 108. A heavily doped N+ channel stop 106 prevents such a p-inversion channel from reaching the die edge 112 where it could short to the drain.

Embodiments

In embodiments of the present invention, the junction termination in a conventional trench MOSFET is replaced with an oxide termination which eliminates junction termination breakdown, improves the UIS capability, and saves space occupied by the junction termination because the oxide requires much less space than a conventional junction termination. In addition, reverse recovery is improved by confining the built-in diode to the active area.

Figure 2:
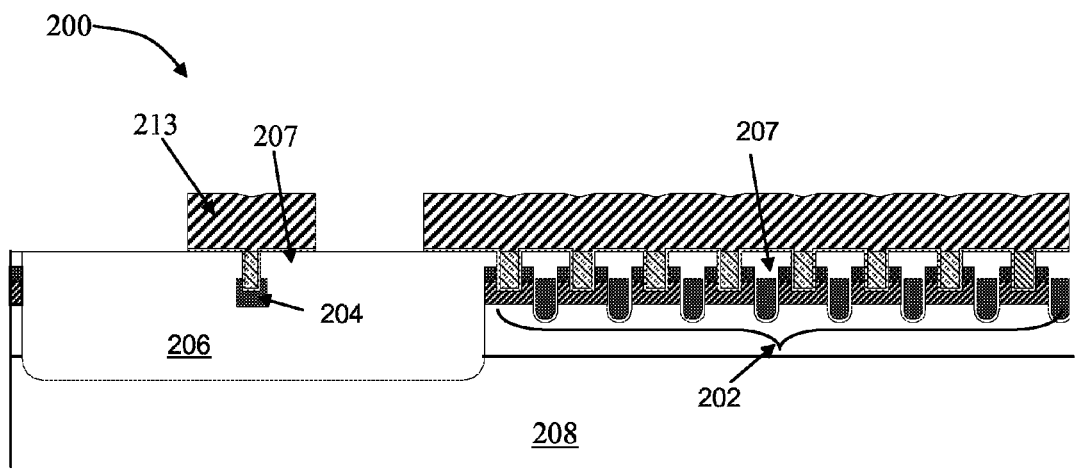
FIG. 2 is a cross-sectional view of an oxide terminated trench MOSFET according to a first embodiment of the present invention.

According to a first embodiment, a gate runner is located in the oxide termination. FIG. 2 is a cross-sectional view of an oxide termination trench MOSFET 200. As shown in FIG. 2, the oxide termination trench MOSFET 200 includes active cells 202 located in an active region and a gate runner 204 positioned inside a large oxide filled trench 206 that is located in a termination region. A dielectric 207 such as Borophosphosilicate glass (BPSG), and/or the large oxide-filled trench 206 can be used to insulate gate pad 213 from the drain voltage. The oxide-filled trench 206, which can also be called the oxide termination trench or the isolation trench, reaches down in to the heavily doped substrate 208. The oxide termination trench 206 prevents a p-inversion layer from forming across it thus eliminating the need for a separate masked channel stop. The oxide termination structure of the trench MOSFET 200 eliminates the junction termination breakdown and therefore improves the UIS capability. The method for making the oxide termination trench MOSFET 200 only requires four masks: an isolation trench mask, a gate trench mask, a contact mask and a metal mask, which is described later in FIGS. 9A-9O. In this method, the deep well mask, the body mask and the source mask are eliminated.

Figure 3A:
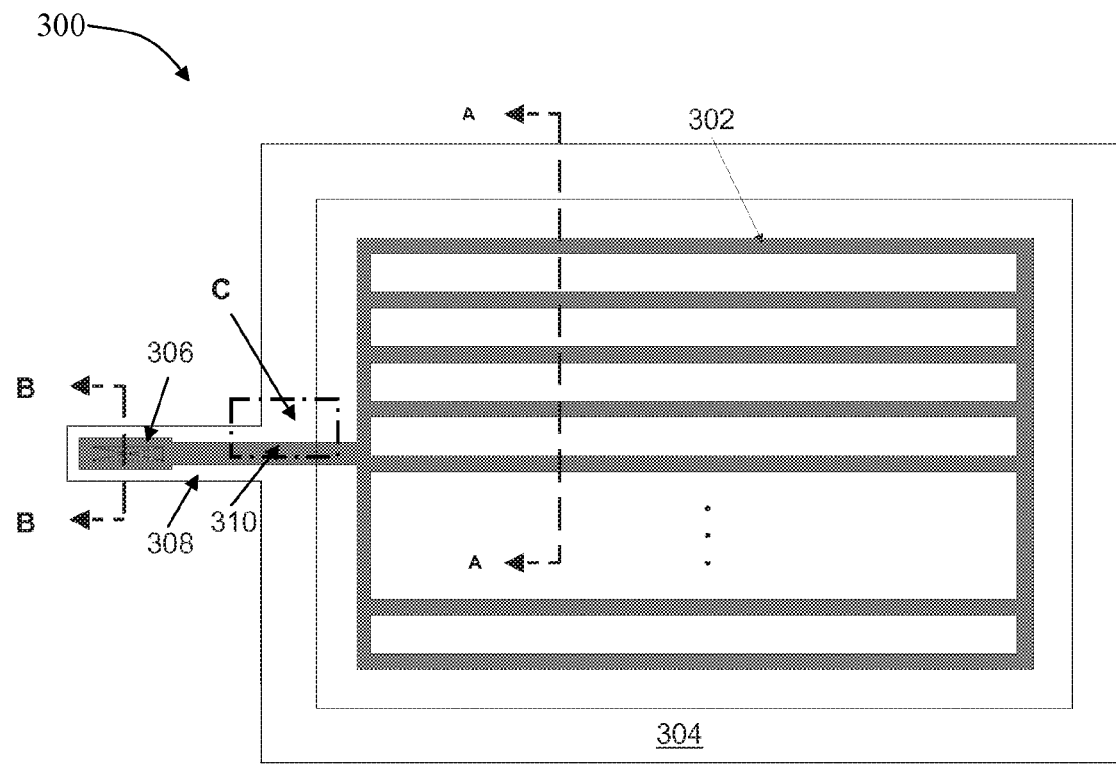
FIG. 3A is a top view of a layout of the oxide terminated trench MOSFET of the first embodiment of the present invention.
Figure 3B:
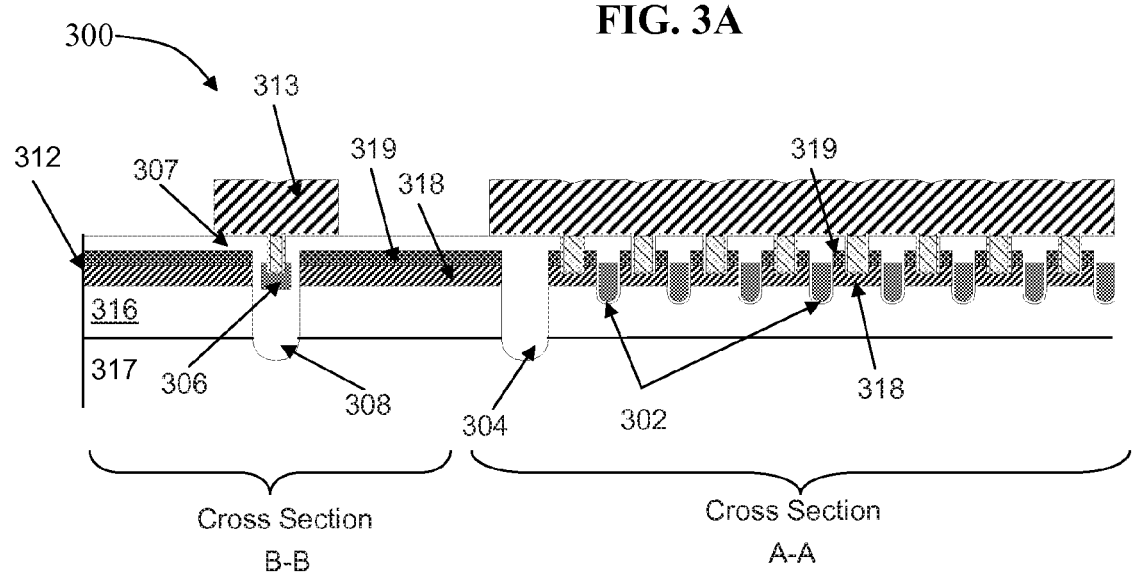
FIG. 3B is a merged cross-sectional view of the oxide terminated trench MOSFET described in FIG. 3A along the lines A-A and B-B.

FIG. 3A is a top view of a layout of the oxide terminated trench MOSFET 300 according to an alternative version of the first embodiment of the present invention and FIG. 3B is a merged cross-sectional view of the oxide terminated trench MOSFET 300 along the lines A-A and B-B.

The difference between trench MOSFET 200 and trench MOSFET 300 is that the large oxide-filled trench 206 in the gate trench MOSFET 200 is replaced with a smaller oxide-filled trench 308 and an isolation oxide trench 304 that acts as a channel stop and device termination in the trench MOSFET 300. The smaller trenches 308 and 304 are easier to manufacture than the large oxide-filled trench 206 in the trench MOSFET 200. As shown in FIGS. 3A-3B, the trench MOSFET 300 includes active gate trenches 302 located in an active region, an isolation oxide trench 304 located in a termination region, and a gate runner 306 located inside an oxide filled trench 308 located in the termination region. A distance t, typically about a few thousand Angstrom, between a side of the gate runner 306 and an outer wall of the oxide filled trench 308 is selected for a predetermined applied voltage. Thicker distance t is required for higher voltage. For example, the distance t is about a 2000 Angstrom for an applied voltage of 60V. Usually, the breakdown field is about 10 MV/cm and for reliable operation the thickness t is calculated for a breakdown field of less than 7MV/cm. As shown in FIG. 3B, due to shorting at the die edge 312, the source 319 and body 318 regions outside the isolation oxide trench 304, including those surrounding the gate runner 306, are at a drain potential. Because the body regions 318 outside the isolation trench are at drain potential, they do not form built in body diodes (as opposed to the active area body regions 318) and so do not add body diode charges, which improves the reverse recovery of the device.

The BPSG layer 307 is formed thick enough to isolate the gate pad 313 from the drain potential. Most of the structures of trench MOSFET 300 are formed at the top of an N− epi layer 316 supported on an N+ substrate 317. There is a small risk of a P-inversion channel forming in the N− epi 316 along the sidewalls of the isolation trench 304 which could allow leakage to thus flow around the bottom of the isolation trench 304. By making the trenches deep enough to enter the N+ substrate 317, the heavily doped N+ substrate 317 can act as a channel stop to prevent such leakage. As can be seen in FIGS. 3A and 3B, the isolation trench 304 borders the active region, with the MOSFET cells and active gates being formed right up to it.

Figure 3C:
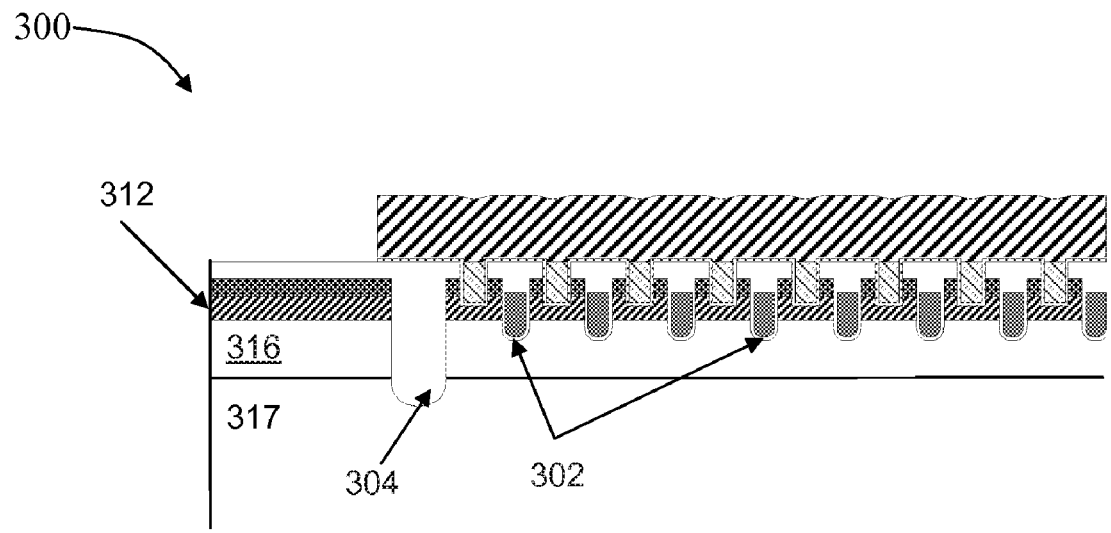
FIG. 3C is a cross-sectional view of the oxide terminated trench MOSFET described in FIG. 3A along the line A-A.

FIG. 3C is a cross sectional view showing only the line A-A of FIG. 3A and the adjacent die edge 312. As can be seen here, the isolation trench 304 allows the active area to be formed closer to the die edge 312 compared to the junction termination of the prior art.

Figure 3D:
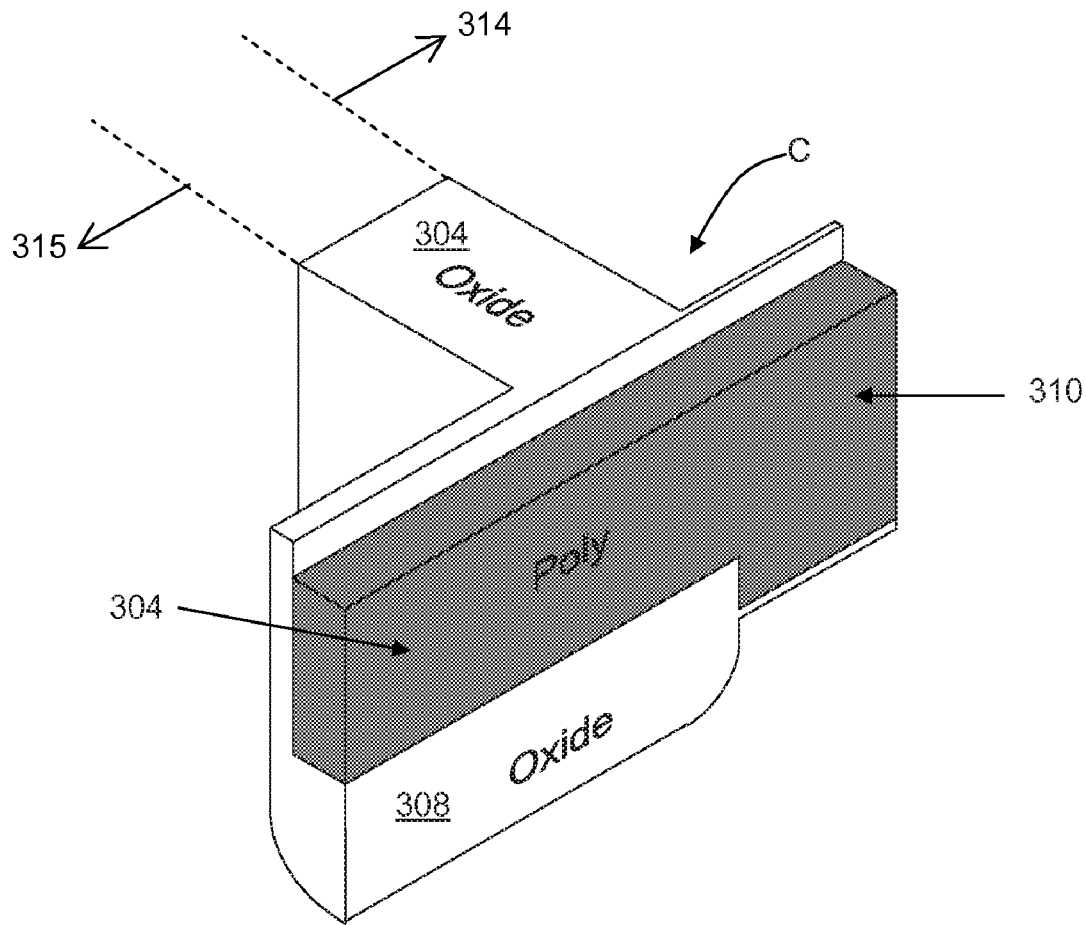
FIG. 3D is a perspective view of the intersection C of the oxide terminated trench MOSFET described in FIG. 3A.

FIG. 3D is a perspective view of a portion of the oxide terminated trench MOSFET 300 at an intersection C between the isolation oxide trench 304 and the oxide-filled trench 308 in the termination region. In an inside region 314 bounded by the isolation oxide trench 304 is an active area, where the source 319 and body 318 regions (not shown in FIG. 3D) are at source potential. In an outside region 315 (termination area) outside of the region bounded by the isolation oxide trench 304, the source 319 and body 318 regions (not shown in FIG. 3D) are at drain potential. As shown in FIG. 3D, the polysilicon 310 on the inside 314 is a gate polysilicon having a gate oxide 318. On the outside 315, the polysilicon 304 is the gate runner 306 and is electrically insulated by the oxide of trenches 304 and 308.

Figure 4A:
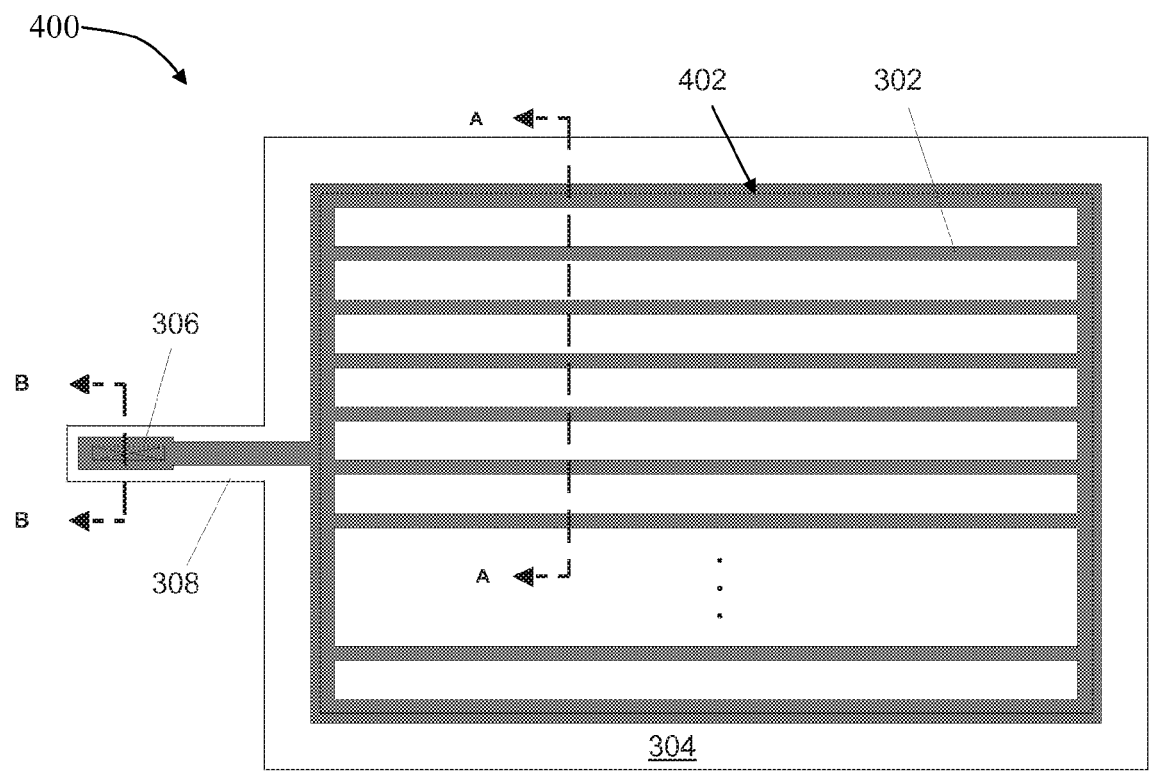
FIG. 4A is a top view of a first alternative layout of the oxide terminated trench MOSFET according to the first embodiment of the present invention.
Figure 4B:
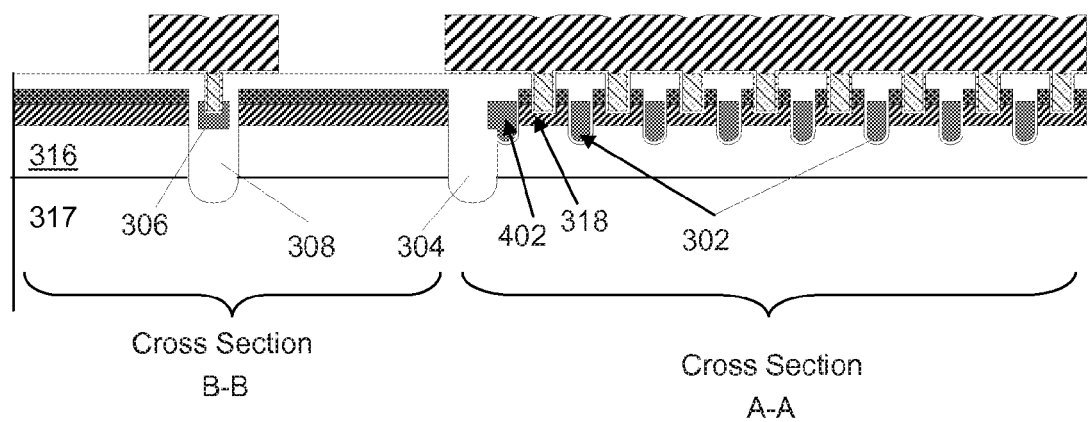
FIG. 4B is a merged cross-sectional view of the oxide terminated trench MOSFET described in FIG. 4A along the lines A-A and B-B.

FIG. 4A is a top view of a layout of an alternative oxide terminated trench MOSFET 400 of the first embodiment of the present invention and FIG. 4B is a cross-sectional view of the oxide terminated trench MOSFET 400 along the lines A-A and B-B.

Similar to the trench MOSFET 300, the trench MOSFET 400 includes gate trenches 302 and an isolation oxide trench 304, which acts as a termination and provides a channel stop for the MOSFET device by being formed deep enough to reach through N-epi 316 to N+ substrate 317, and a gate runner 306 located in an oxide-filled trench 308. In addition, the trench MOSFET 400 includes an extra gate trench 402 located outside of the gate trenches 302 and abutting the isolation oxide trench 304 with about half the width of the extra gate trench 402 overlapping the isolation oxide trench 304. In trench MOSFET 300 of FIG. 3B, there is a slight risk of an (n−) channel forming in the active area (P−) body region 318 on the inside sidewall of the isolation trench 304 due to the drain potential on the other side of the isolation trench, causing leakage current. This extra gate trench 402 shields that region from the drain potential and stops the turn-on of that channel.

Figure 5A:
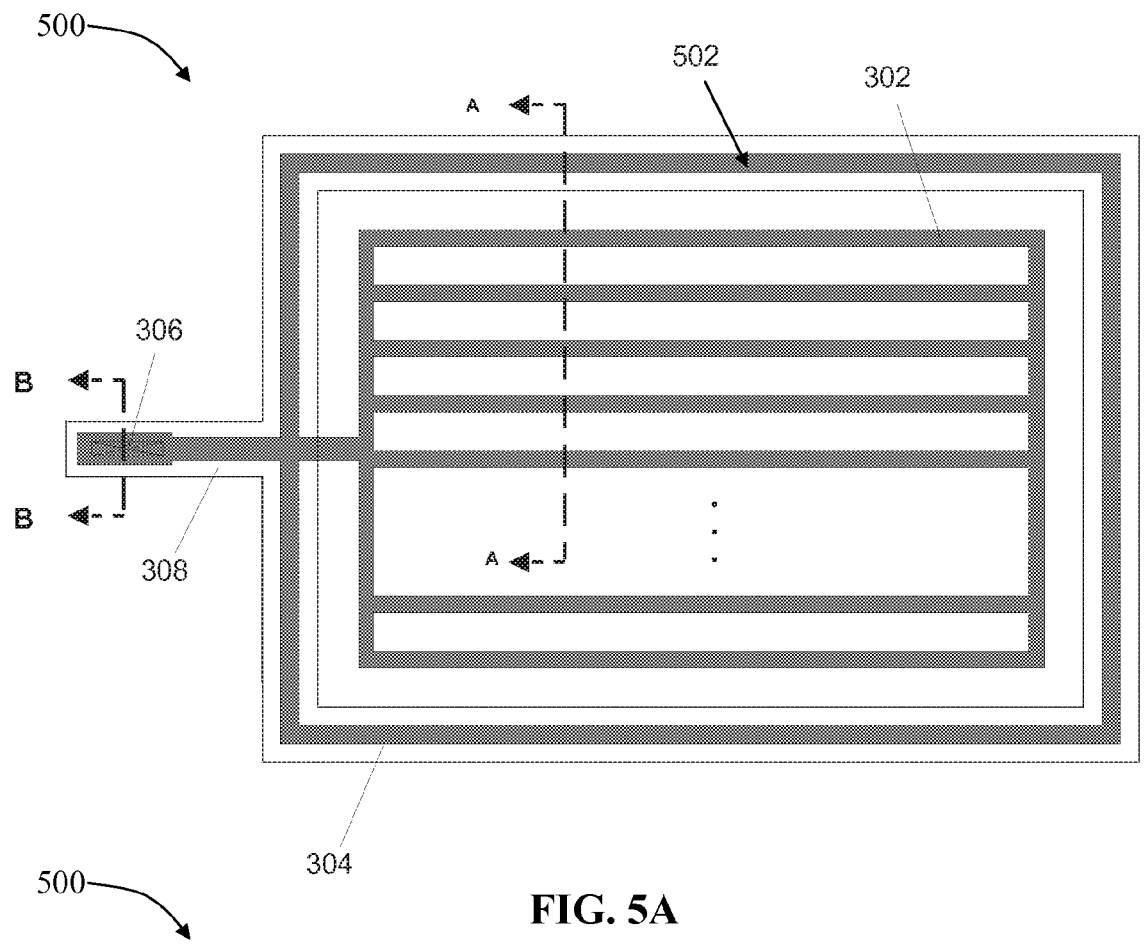
FIG. 5A is a top view of a second alternative layout of the oxide terminated trench MOSFET according to the first embodiment of the present invention.
Figure 5B:
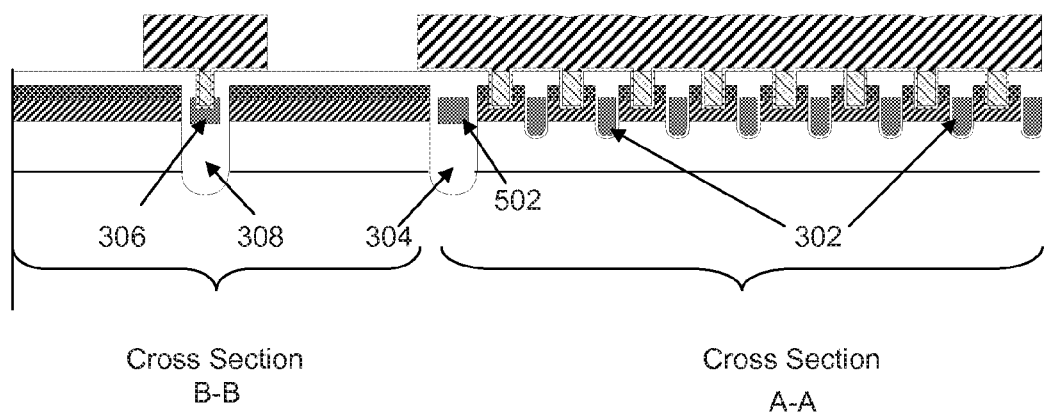
FIG. 5B is a merged cross-sectional view of the oxide terminated trench MOSFET described in FIG. 5A along the lines A-A and B-B.

FIG. 5A is a top view of a layout of another alternative oxide terminated trench MOSFET 500 of the first embodiment of the present invention and FIG. 5B is a cross-sectional view of the oxide terminated trench MOSFET 500 along the lines A-A and B-B.

Similar to the trench MOSFET 300, the trench MOSFET 500 includes gate trenches 302 and an isolation oxide trench 304, which acts as a termination and forms a channel stop for the MOSFET device, and a gate runner 306 located in an oxide-filled trench 308. In addition, the trench MOSFET 500 includes an extra gate runner 502 located outside of the gate trenches 302 and in the isolation oxide trench 304. Similar to extra gate trench 402 of trench MOSFET 400, the extra gate runner 502 also shields against a parasitic n-channel forming on the inside of the isolation trench 304.

Figure 6:
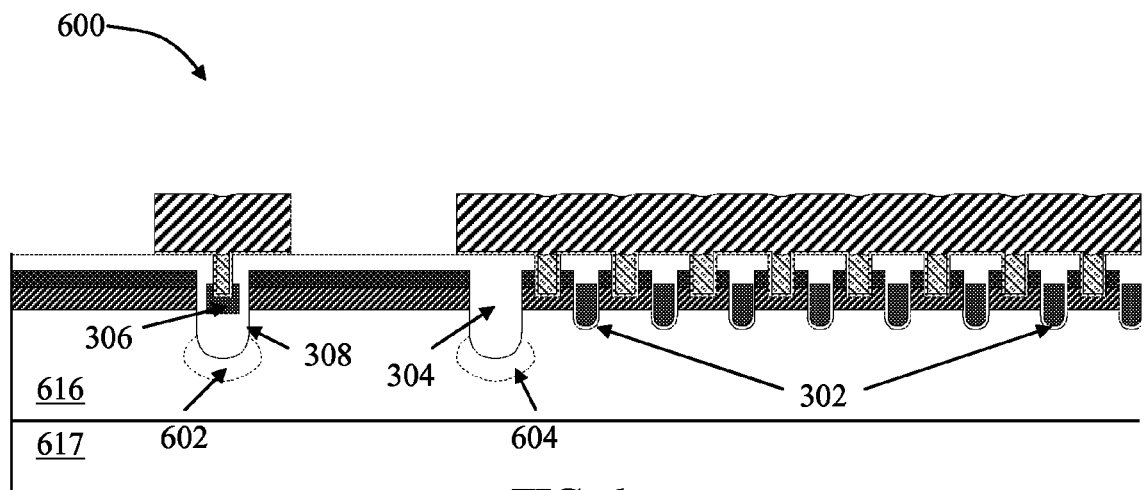
FIG. 6 is a cross-sectional of the oxide terminated trench MOSFET described in FIG. 3B with channel stop implanted in the bottom of termination trench.

FIG. 6 is a cross-sectional of the oxide terminated trench MOSFET 600, which is similar to the trench MOSFET 300 and further includes a channel stop 602 implanted at the bottom of the oxide-filled trench 308 and a channel stop 604 implanted at the bottom of the isolation oxide trench 304. In this embodiment, the oxide-filled trench 308 and isolation trench 304 are not deep enough to reach the N+ substrate 619 (whether the trenches are shallower than before, or the epi layer 618 is deeper than before) so self-aligned N+ implants can be formed into the bottom of the trenches 308, 304 to form channel stops 602 and 604.

Figure 7:
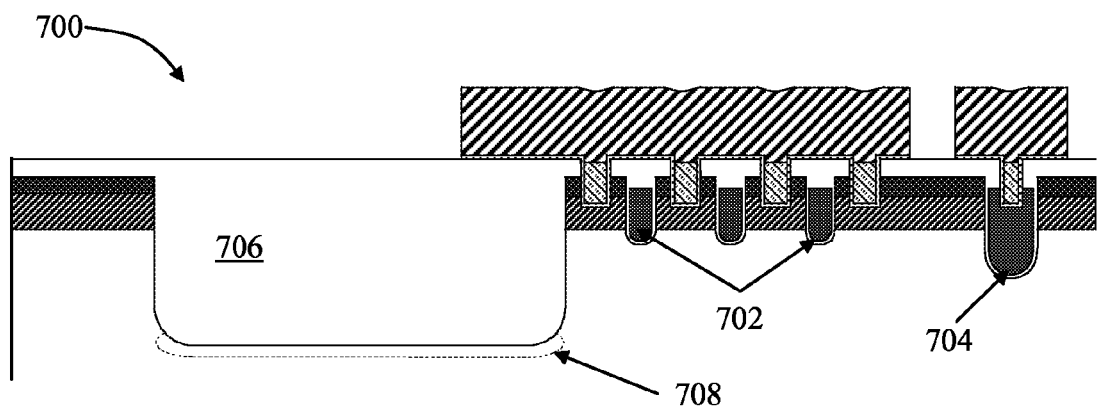
FIG. 7 is a cross-sectional view of an oxide terminated trench MOSFET according to a second embodiment of the present invention.

In a second embodiment, the junction termination of a conventional trench MOSFET can be replaced with an oxide termination having a gate runner located in the active cell region. FIG. 7 is a cross-sectional view of an oxide termination trench MOSFET 700. As shown in FIG. 7, the oxide termination trench MOSFET 700 includes active cells 702 and a gate runner 704, which is located in the active region between the active cells 702. An oxide termination 706 is located in the termination region. Channel stop 708 is implanted at the bottom of the oxide termination 706. The oxide termination structure of the trench MOSFET 700 eliminates the junction termination breakdown and therefore improves the UIS capability. The method for making the oxide termination trench MOSFET 700 only requires three masks: a gate trench mask, a contact mask and a metal mask, which is described later in FIGS. 10A-10K. In this method, the deep well mask, the body mask and the source mask are eliminated.

Figure 8A:
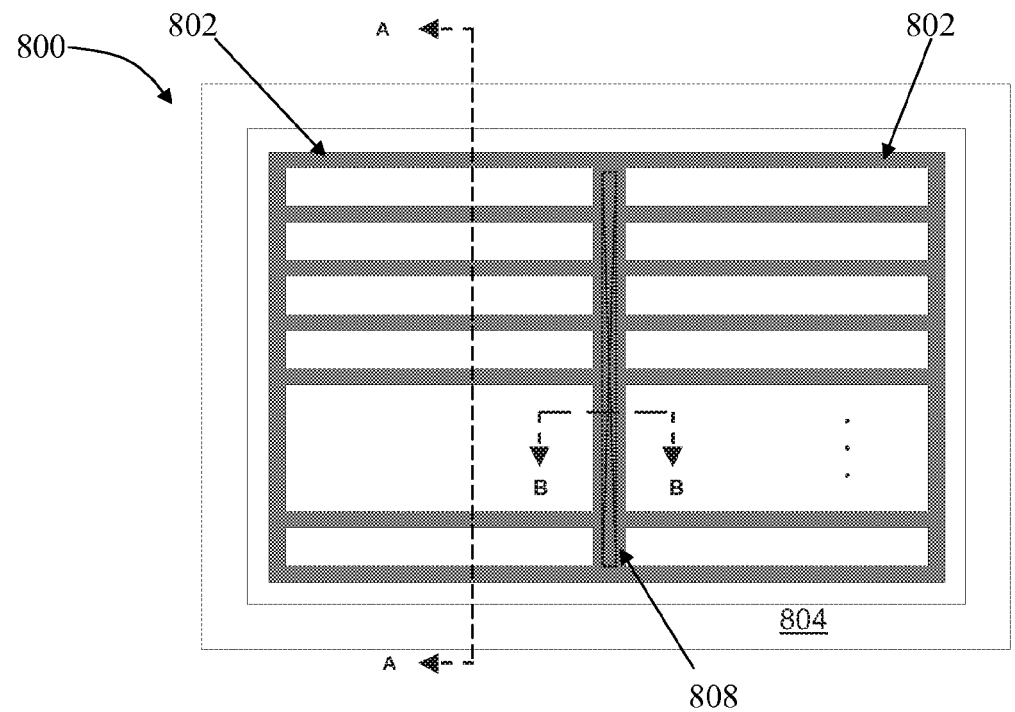
FIG. 8A is a top view of a layout of the oxide terminated trench MOSFET of the second embodiment of the present invention.

The difference between trench MOSFET 700 and trench MOSFET 800 is the large oxide termination 706 in the trench MOSFET 700 is replaced with the smaller oxide isolation trench 804 in the trench MOSFET 800. FIG. 8A is a top view of a layout of the oxide terminated trench MOSFET 800 and FIG. 8B is a cross-sectional view of the oxide terminated trench MOSFET 800 along the lines A-A and B-B.

Figure 8B:
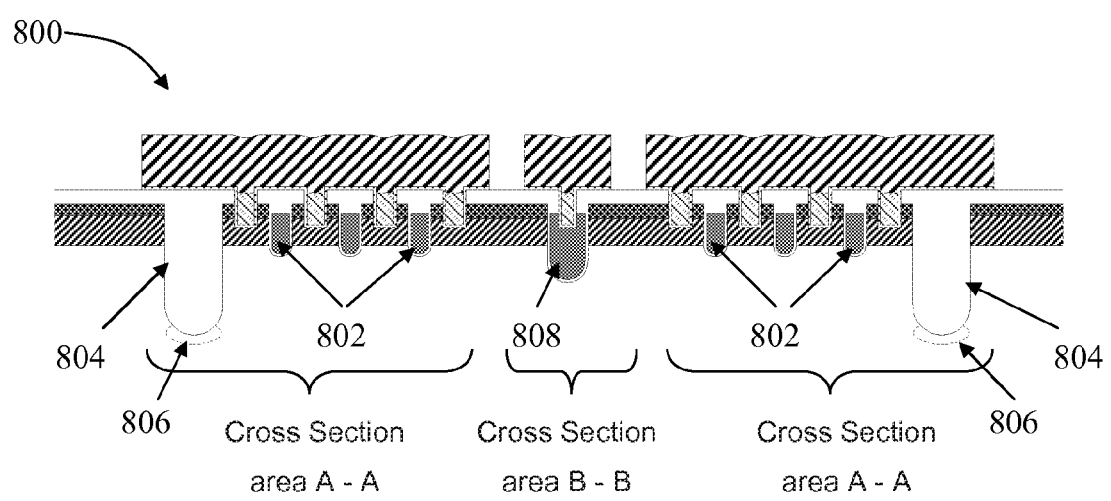
FIG. 8B is a merged cross-sectional view of the oxide terminated trench MOSFET described in FIG. 8A along the lines A-A and B-B with channel stop implanted in the bottom of termination trench.

As shown in FIGS. 8A-8B, the trench MOSFET 800 includes gate trenches 802 located in an active region, each of which contains a gate electrode, and an oxide isolation trench 804 located at a termination region to terminate the active cells. A gate runner 808 is positioned in the active region, in the middle of the active gate trenches 802. Channel stop 806 can be implanted at the bottom of the oxide isolation trench 804 if they are not deep enough to reach the substrate (not shown).

Figure 9A:
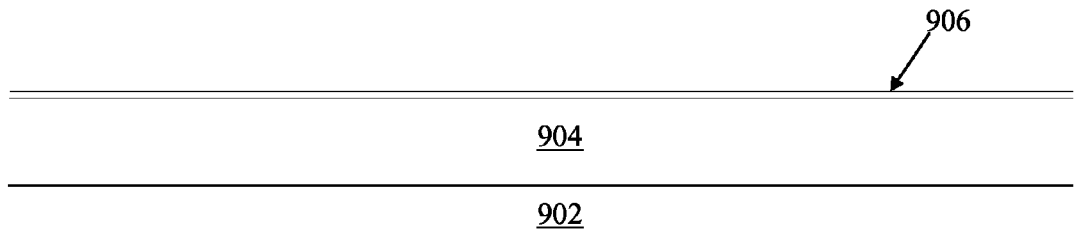
FIGS. 9A-9O are cross-sectional views illustrating the steps of making the oxide terminated trench MOSFET described in FIG. 2 or FIG. 3A of the first embodiment of the present invention.
Figure 9B:
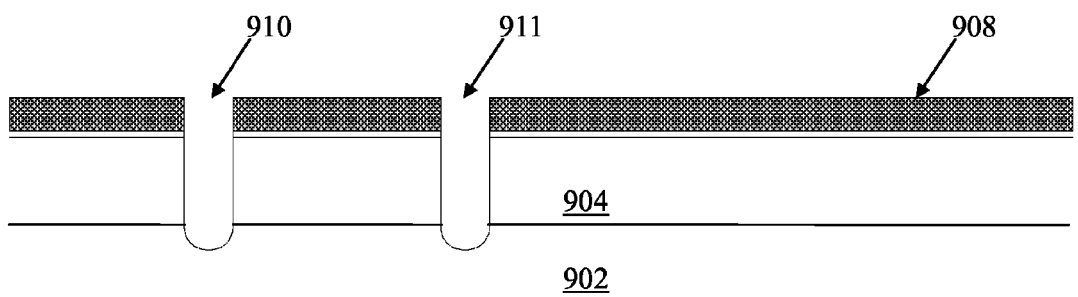
Figure 9C:
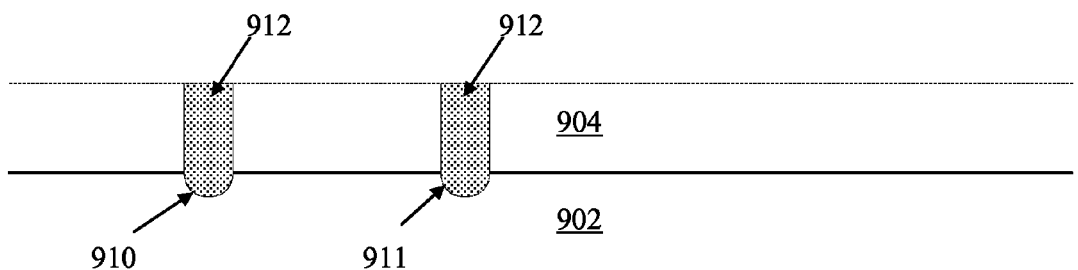
Figure 9D:
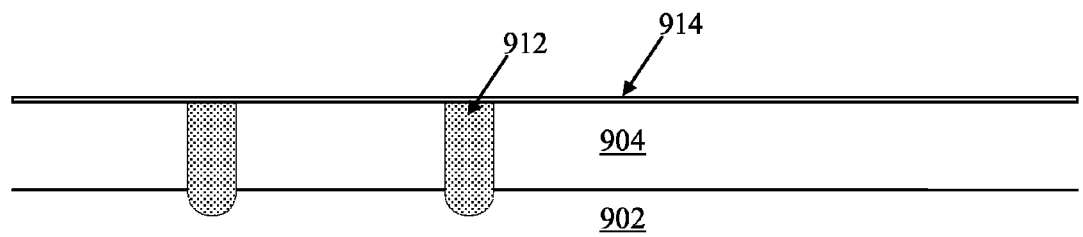
Figure 9E:
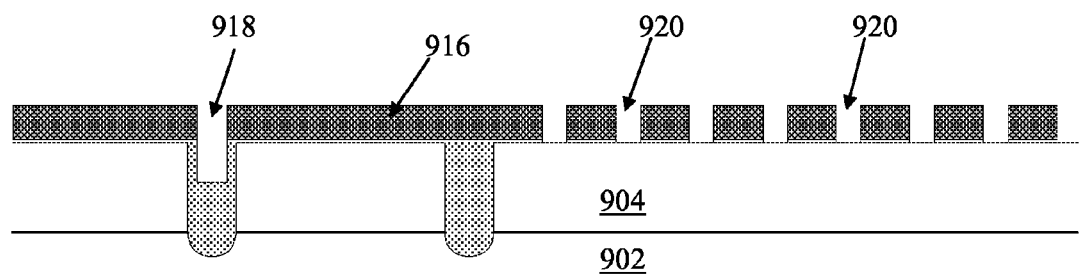
Figure 9F:
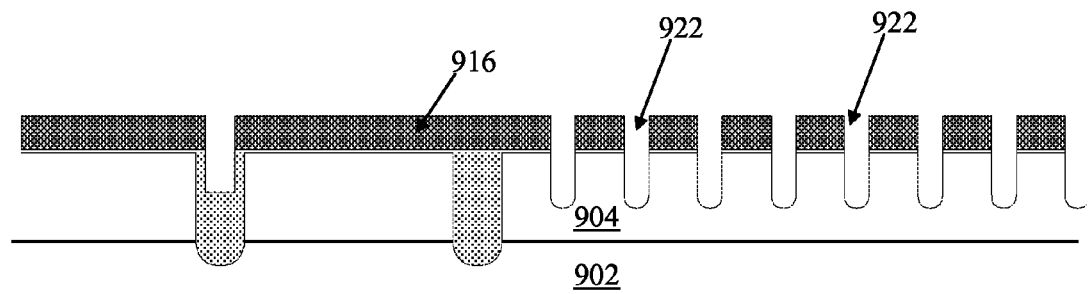
Figure 9G:
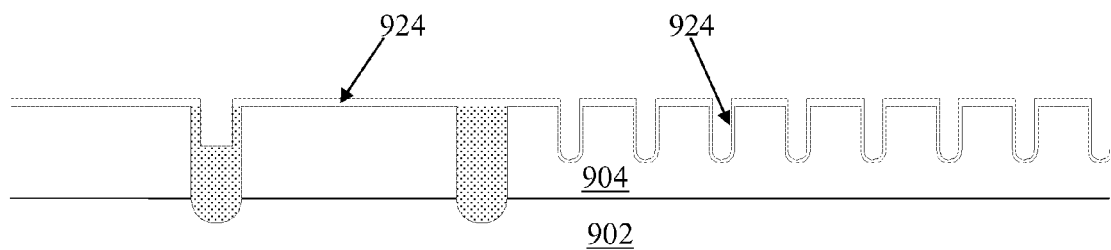
Figure 9H:
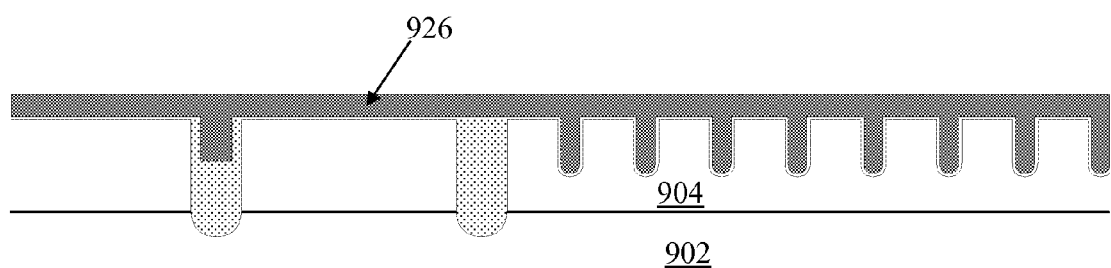
Figure 9I:
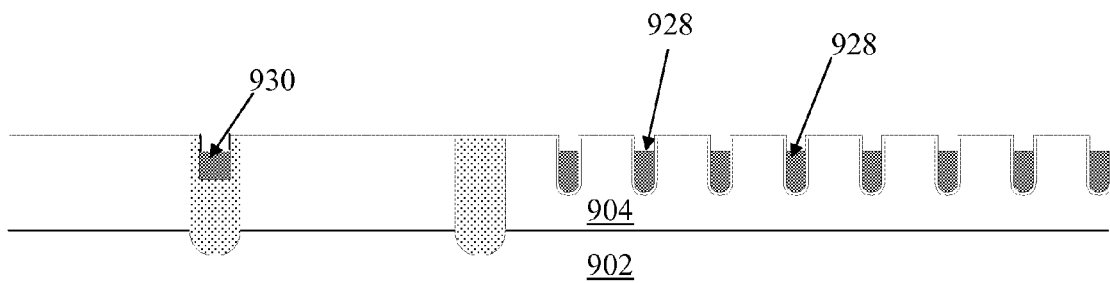
Figure 9J:
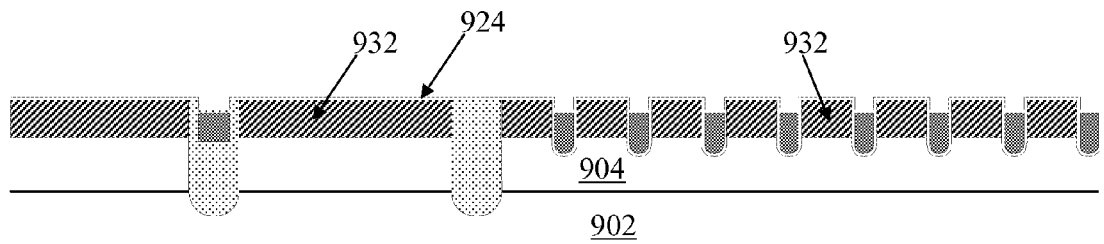
Figure 9K:
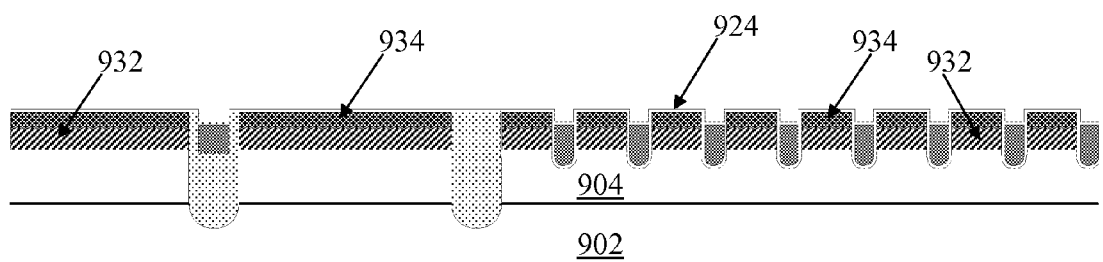
Figure 9L:
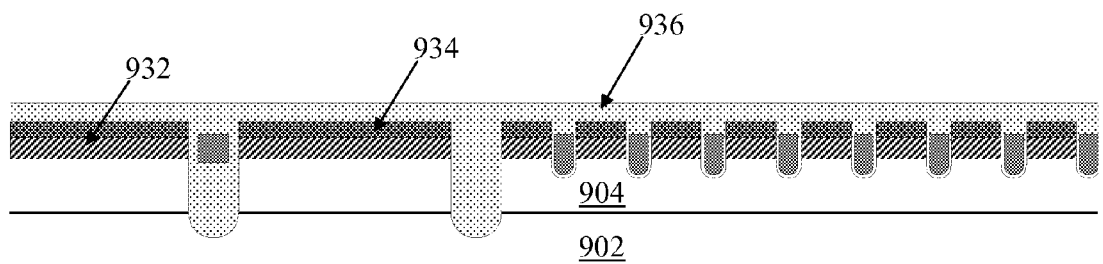
Figure 9M:
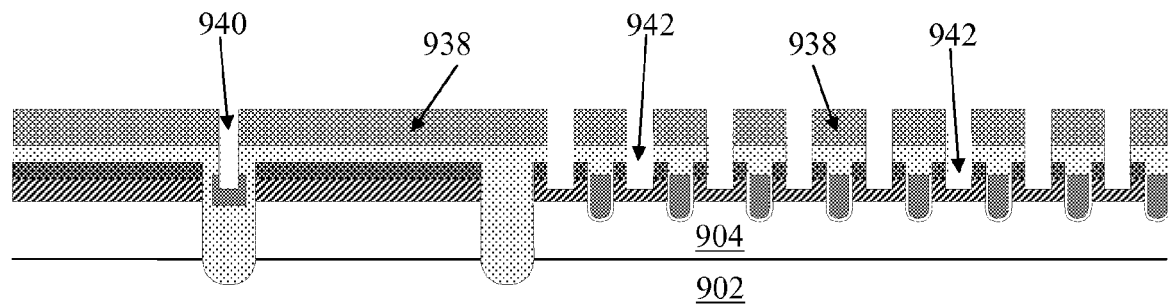
Figure 9N:
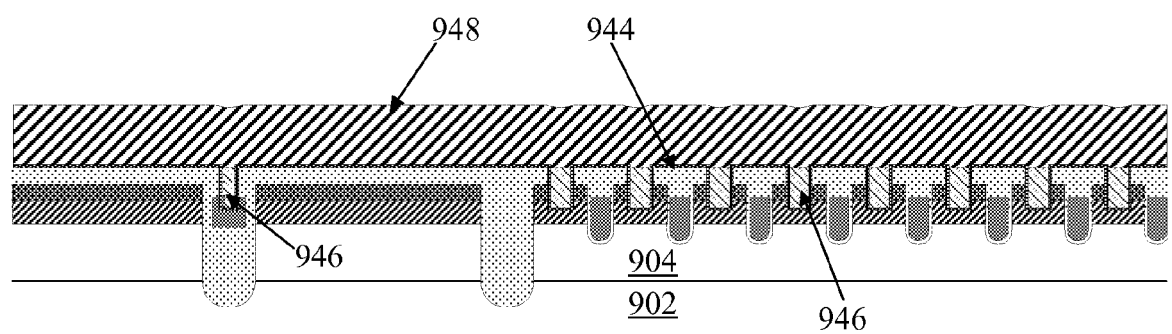
Figure 9O:
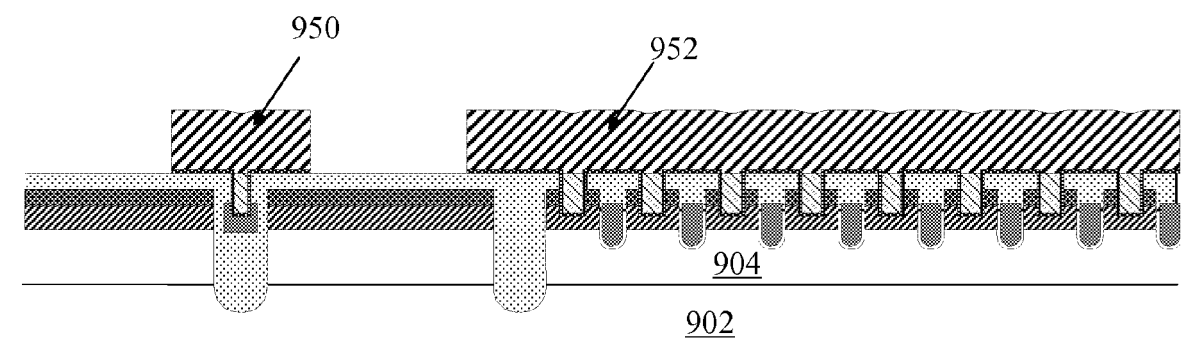

FIGS. 9A-9O are cross-sectional views illustrating a four mask process for making the oxide termination trench MOSFET of the type depicted in FIGS. 3A-3B as described above. As shown in FIG. 9A, a semiconductor substrate that includes e.g., a relatively lightly doped epitaxial (epi) layer 904 located on top of a heavily doped substrate 902 is provided. By way of example and not by way of limitation, the epitaxial layer 904 may be doped n– and the substrate 902 may be doped n+. An oxide layer 906 may be formed on a top surface of the epi layer 904. By way of example an oxide may be formed by a combination of thermal oxidation and deposition of low temperature oxide or high density plasma (HDP). A first mask 908, which is an isolation trench mask, patterned with openings that define isolation and gate runner trenches is applied on top of the oxide layer 906 as shown in FIG. 9B. Trenches 910, 911 are formed by etching through the oxide layer 906, the epi layer 904 and optionally a top portion of the substrate 902. This may be performed by an oxide etch to etch through oxide layer 906, followed by a silicon etch to etch into epi layer 904. After the oxide etch, the oxide layer 906 may act as a hard mask for the silicon etch. Trench 910 will form a gate runner later in the process. For convenience this trench 910 is referred to as gate runner trench. Another trench 911 may be used to form an isolation oxide termination for the active region. For convenience this trench 911 is referred to as an isolation oxide trench. If the trench 911 does not reach the (n+) substrate, a channel stop implant (not shown) may be formed at this point at the bottom of the trenches.

By way of example, and not by way of limitation, a width of the trenches 910, 911 can be about 1.5 microns. As shown in FIG. 9C, the first mask 908 can be removed and the trenches 910, 911 can be filled with oxide 912 following by a densification and chemical-mechanical-polishing (CMP).

As shown in FIG. 9D, a thin oxide layer 914 can be grown or deposited on top of the trenches 910 and the epi layer 904. A second mask 916, which is a trench mask, patterned with openings that define trenches is applied on top of the thin oxide layer 914. A gate runner cavity 918 is formed in the trench 910 by etching through the thin oxide layer 914 and portions of the oxide 912 in the mask openings 920 as shown in FIG. 9E by an oxide etch, which is highly selective to etching oxide rather than silicon. Trenches 922 can then be formed using the same mask 916 by etching the epi layer 904 using a silicon etch as shown in FIG. 9F. Trenches 922 can be used to form gate pads/electrodes later in the process. For convenience these trench 922 are referred to as gate trenches. The trench 910 is wider than the trenches 922 to allow for formation of gate runner cavity 918. Typically the gate runner cavity is also wider than trench 922 for improved conduction, and to make room for a gate metal contact. Typically, the gate runner cavity 918 has a width of about 1.0 microns and the trench 922 has a width of about 0.4 to about 0.8 microns.

The second mask 916 is then removed following by forming a sacrificial oxide (which is then removed) and a gate oxide 924 as shown in FIG. 9G. Conductive material 926 (e.g., polysilicon) can be deposited into trenches 918 and 922 and on top of the gate oxide 924 as shown in FIG. 9H. The conductive material can be 926 doped with dopants (e.g., n+ type dopants) to make it more conductive. The conductive material 926 can then be etched back to form a gate runner 930 in the trench 918 and gate electrodes 928 in the trenches 922 as shown in FIG. 9I.

As shown in FIG. 9J, a body layer 932 is formed at a top portion of the epi layer 904 without the use of a mask. The body layer 932 may be formed, e.g., by blanket vertical or angled implantation and diffusion of suitable type dopants of a type opposite that of the epi layer. Dopant ions may be implanted through the oxide layer 924. By way of example, if the epi layer is n-doped, the body layer may be doped with p-type dopants and vice versa. A source layer 934 is formed at a top portion of the body layer 932 without the use of a mask as shown in FIG. 9K. The source layer 934 may be formed, e.g., by blanket vertical or angled implantation of suitable dopants through the oxide 924 followed by annealing. The dopants implanted to form the source layer 934 are generally of an opposite type to the body layer 932. For example, if the body layer 932 is doped p-type, the source layer 934 would be doped n-type and vice versa.

As shown in FIG. 9L, an insulator layer 936, e.g., a low temperature oxide layer and borophosphosilicate glass (BPSG), is formed on top of the structure followed by densification and CMP planarization.

As shown in FIG. 9M, a contact mask 938 is formed on the insulator layer 936 and patterned with openings that define contact holes. The contact mask 938 is the third photomask used in this process. The insulator layer 936, the source layer 934 and portions of the body layer 932 may be etched through the openings in the mask to form source/body contact holes 942 and the oxide in the trenches 918 and a portion of the gate runner 930 are etched down to form gate contact hole 940, e.g., by oxide etch followed by a silicon etch.

As shown in FIG. 9N, a layer 944 of a barrier material, such as Ti/TiN, may be deposited into the contact holes 940 and 942. A conductive (e.g., tungsten (W)) plug 946 may then be used to fill up the contact holes 940 and 942. The barrier metal 944 and tungsten plug 946 in the contact holes 942 over the source regions 934 provide source/body contacts. The barrier metal 944 and tungsten plug 946 in the contact holes 940 over the gate runner 930 provide gate contact. A metal layer 948, e.g. Al—Si, may then be deposited on top of the resulting structure.

A patterned metal mask (not shown) is formed on the metal layer 948, patterned and developed followed by a metal etch to separate the metal layer 948 into electrically isolated portions that form gate and source metals such as gate metal 950 and source metal 952 to form a device like semiconductor device 300 of FIGS. 3A-3B. The metal mask is the fourth photomask in this process. The barrier metal 944 and tungsten plug 946 in the contact holes 942 over the source regions provide source/body contacts from the source layer 934 and body layer 932 to the source metal 952. The barrier metal 944 and tungsten plug 946 in the contact holes 940 over trench 910 provide vertical gate runner contacts from the gate runner 930 to the gate metal 950. Afterwards, a drain metal (not shown) may be formed on the back side of the device, without the use of additional masks.

Figure 10A:
FIGS. 10A-10K are cross-sectional views illustrating the steps of making an oxide terminated trench MOSFET of the type described in FIG. 7 or FIG. 8A according to the second embodiment of the present invention.
Figure 10B:
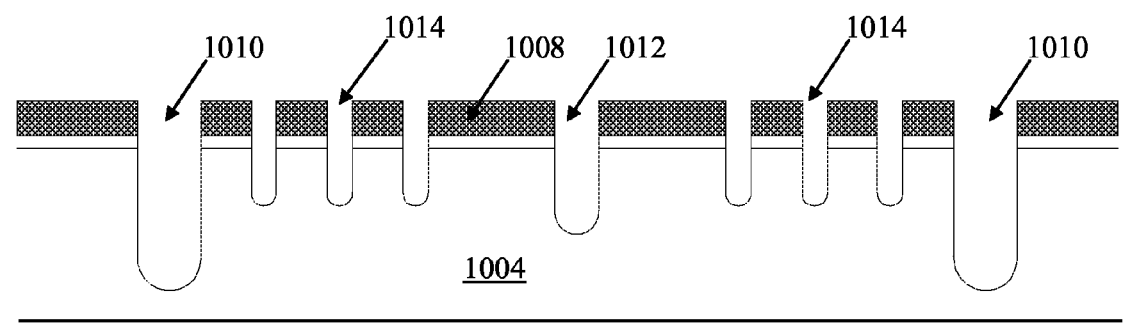

In an alternative embodiment, an oxide termination trench MOSFET may be manufactured using a three-mask process. By way of example, FIGS. 10A-10K are cross-sectional views illustrating a three masks process for making the oxide termination trench MOSFET of the type depicted in FIGS. 8A-8B as described above. As shown in FIG. 10A, a semiconductor substrate that includes e.g., a relatively lightly doped (e.g., n−) epitaxial (epi) layer 1004 located on top of a heavily doped (e.g., n+) substrate 1002 is provided. An oxide layer 1006 may be formed on a top surface of the epi layer 1004. By way of example an oxide may be formed by a combination of thermal oxidation and deposition of low temperature oxide or high density plasma (HDP). A first mask 1008, referred to as the trench mask, is patterned with openings that define trenches is applied on top of the oxide layer 1006 as shown in FIG. 10B. Trenches 1010, 1012, 1014 can be formed by etching through the oxide layer 1006, the epi layer 1004 and optionally a top portion of the substrate 1002. Wider trench openings tend to result in deeper trenches, so trenches of varying depths may be simultaneously formed using the same mask etch step. Trenches 1014 can be used to form active gate electrodes later in the process. For convenience the trenches 1014 are referred to as gate trenches. Trench 1012 can be used to form a gate runner later in the process. For convenience trench 1012 is referred to as a gate runner trench. Another trench 1010 may be used to form an isolation oxide termination for the active region. For convenience this trench 1010 is referred to as an isolation oxide trench.

The gate runner trench 1012 is wider than the gate trench 1014, e.g., about 1.2 microns. The oxide termination trench 1010 is wider than the gate runner trench 1012, e.g., about 1.5 microns. For a given etch duration, the wider the mask opening, the deeper the trench can be etched by an anisotropic etch process, e.g., dry etch.

Figure 10C:
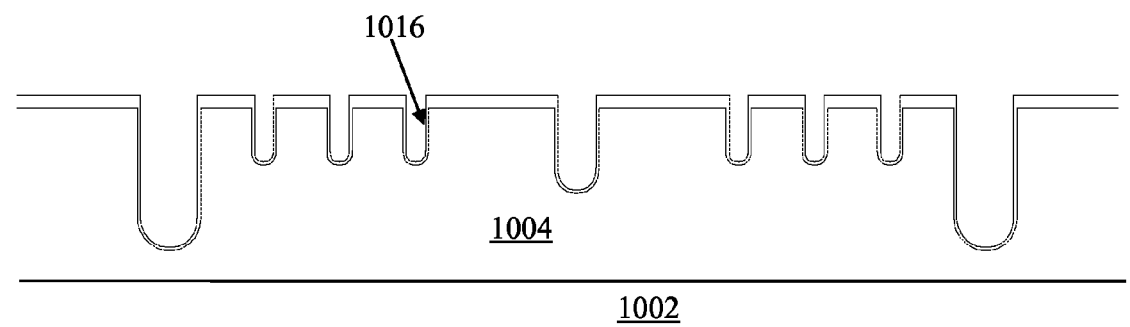
Figure 10D:
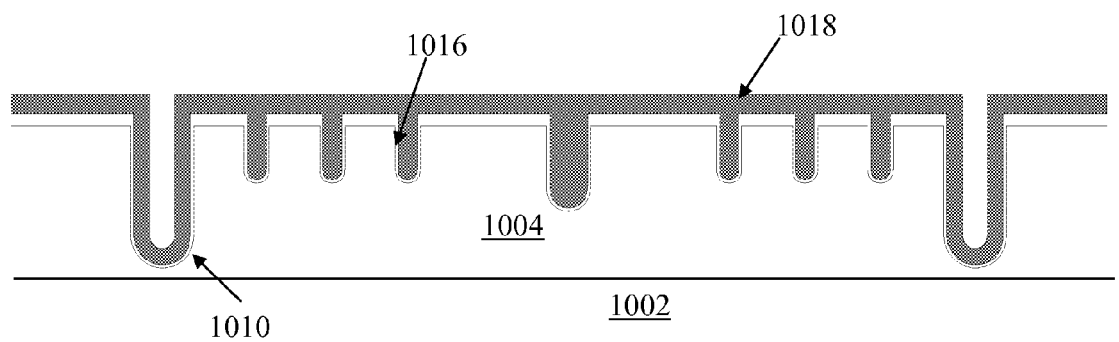

The first mask 1008 can then be removed followed by formation of a sacrificial oxide and then a gate oxide 1016 on the trench sidewalls as shown in FIG. 10C. Conductive material (e.g., polysilicon) 1018 can be deposited into trenches 1010, 1012 and 1014 on top of the gate oxide 1016 as shown in FIG. 10D. The thickness of the conductive material 1018 is selected to fill up all the smaller trenches 1012 and 1014, but not the widest trench 1010. The widest trench 1010 is only lined with conductive material 1018. The conductive layer 1018 can be doped with dopants, e.g., n+ type dopants, to enhance conductivity.

Figure 10E:
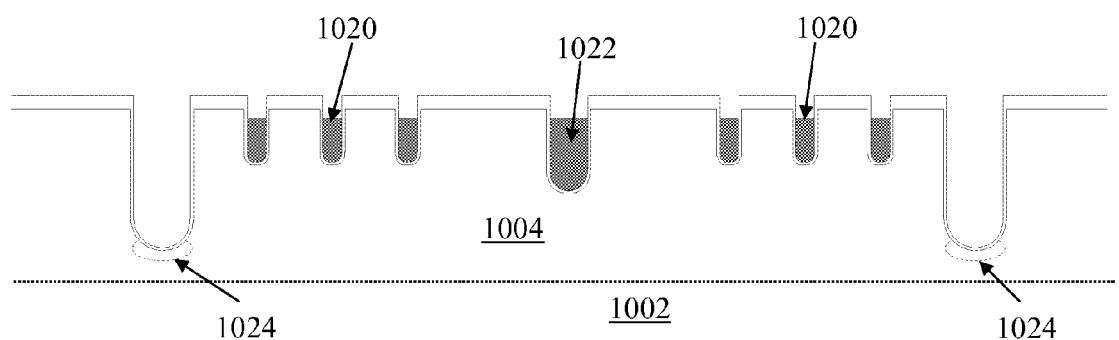
Figure 10F:
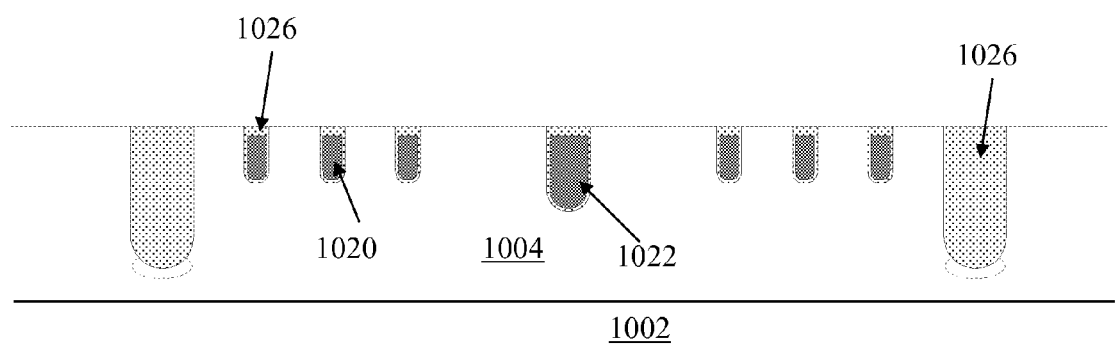

As shown in FIG. 10E, the conductive layer 1018 can be isotropically etched back with an etch endpoint below the top surface of the epi layer 1004 to form a gate runner 1022 in the trench 1012 and gate electrodes 1020 in the trenches 1014. Conductive material 1018 in trenches 1010 is completely removed in this etch step. Channel stops 1024 can be optionally implanted at the bottom of the trenches 1010 if they do not reach the substrate 1002. An oxide 1026 is deposited on top of the resulting structure to fill in trenches 1010 and the tops of trenches 1012 and 1014 followed with a chemical-mechanical-polishing (CMP) as shown in FIG. 10F.

Figure 10G:
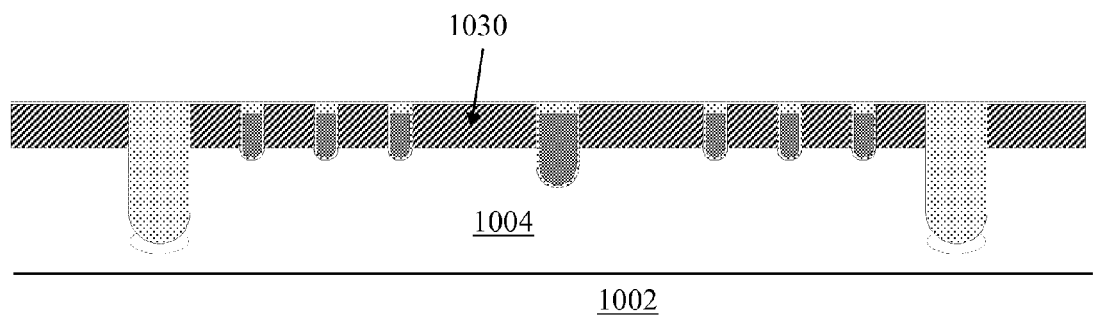
Figure 10H:
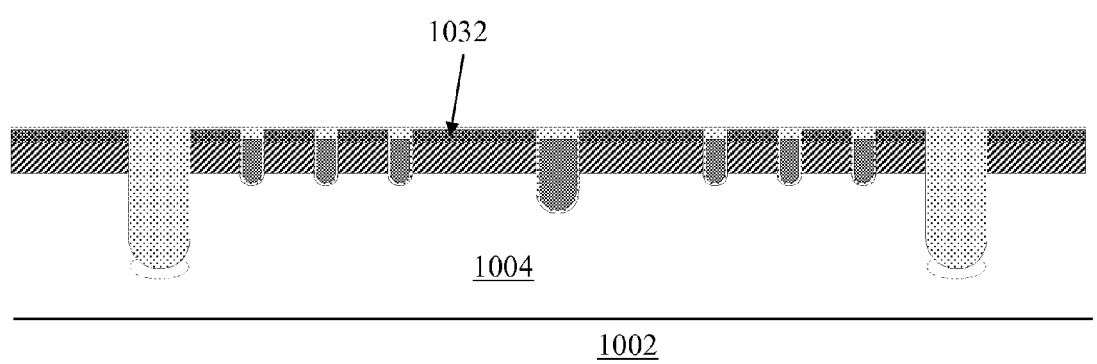

As shown in FIG. 10G, a body layer 1030 can be formed at a top portion of the epi layer 1004. The body layer 1030 may be formed, e.g., by vertical or angled implantation and diffusion of dopants of an opposite type to that of the epi layer 1004. A source layer 1032 can be formed at a top portion of the body layer 1030 as shown in FIG. 10H. The source layer 1032 may be formed, e.g., by vertical or angled implantation of dopants of an opposite type to that of the body layer and annealed.

Figure 10I:
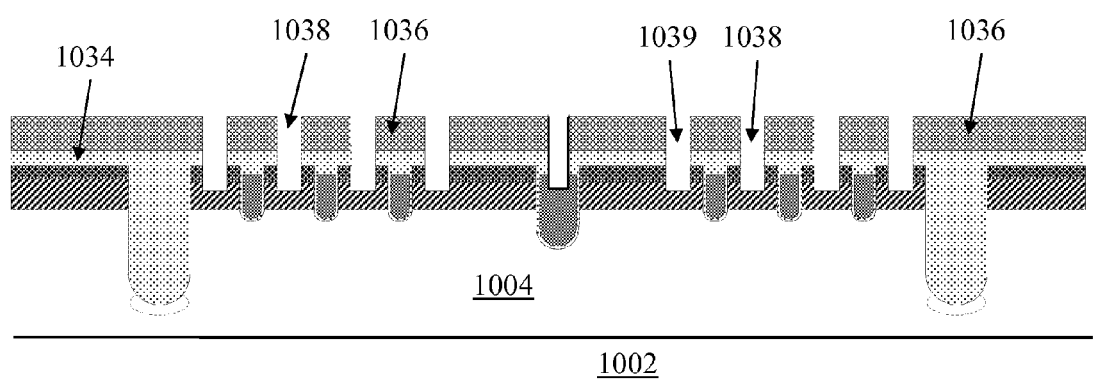

As shown in FIG. 10I, an insulator layer 1034, e.g., a low temperature oxide layer and borophosphosilicate glass (BPSG), can be formed on top of the structure followed by densification and CMP planarization. A contact mask 1036 can be formed on the insulator layer 1034 and patterned with openings that define contact holes. The contact mask 1036 is the second photomask used in this process. The insulator layer 1034, the source layer 1032 and top portions of the body layer 1030 may be etched through the openings in the mask to form source/body contact holes 1038. The insulator layer 1034 and a top portion of the gate runner 1022 may be etched through the openings in the mask to form gate contact holes 1039.

Figure 10J:
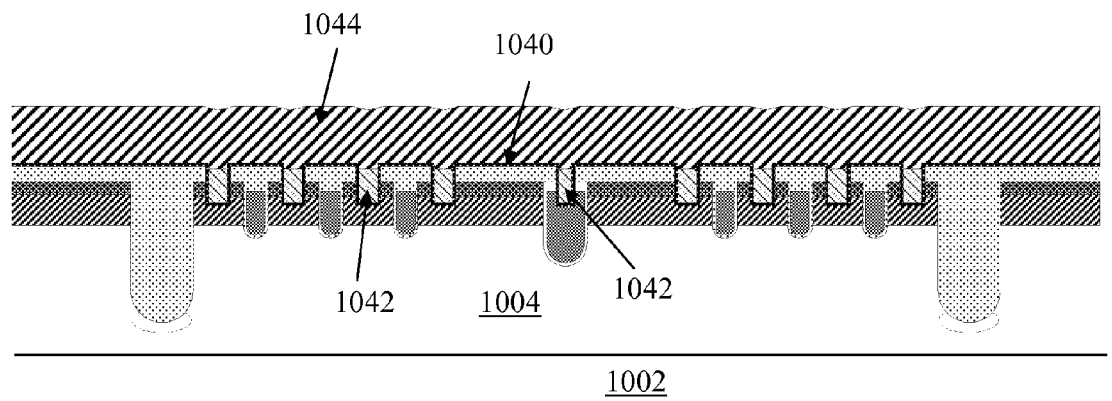
Figure 10K:
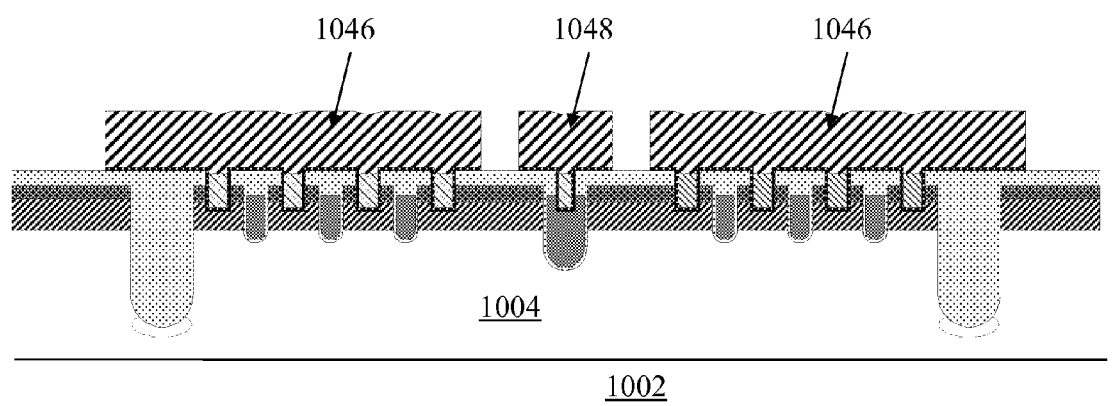

As shown in FIG. 10J, a layer 1040 of an electrically conductive barrier material, such as Ti/TiN, may be deposited into the contact holes 1038 and 1039 and on top of insulator layer 1034. A conductive (e.g., tungsten (W)) plug 1042 may then be used to fill up the contact holes 1038 and 1039. The barrier metal 1040 and conductive plug 1042 in the contact holes 1038 over the source regions 1032 provide source/body contacts. The barrier metal 1040 and plug 1042 in the contact holes 1039 over the gate runner 1022 provide gate contact. A metal layer 1044, e.g., Al—Si, may then be deposited on top of the resulting structure.

A patterned metal mask (not shown) is deposited on the metal layer 1044 followed with a metal etch to separate the metal layer 1044 into electrically isolated portions that form gate and source metals such as gate metal 1048 and source metal 1046 to form a device like semiconductor device 800 of FIGS. 8A-8B. The metal mask is the third photomask in this process. A drain metal may then be formed on the backside of the device without additional masks. The barrier metal 1040 and tungsten plug 1042 in the contact holes 1038 over the source regions provide source/body contacts from the source layer 1032 and body layer 1030 to the source metal 1046. The barrier metal 1040 and tungsten plug 1042 in the contact holes

1039 over trench 1012 provide vertical gate runner contacts from the gate runner 1022 to the gate metal 1048.

As may be seen from the foregoing description, embodiments of the present invention allow for manufacture of trench MOSFET devices using fewer masks than conventional processes. The resulting structure eliminates junction termination breakdown, improves UIS capability, and saves space occupied by the junction termination because the oxide takes up much less space than a conventional junction termination. In addition, reverse recovery is improved by confining the built-in body diodes to the active area.

While the above is a complete description of the preferred embodiment of the present invention, it is possible to use various alternatives, modifications and equivalents. For example, an n-channel MOSFET device is shown in the examples above, but a p-channel MOSFET is also possible by reversing the conductivity type of the regions. Also though a MOSFET is shown, one skilled in the art should be able to tell that the same principles could be applied to an IGBT device. Also, oxide can be replaced with another suitable insulator. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An insulator termination semiconductor device comprising:
    a plurality of gate trenches located in an active region, each of which includes a conductive gate electrode;
    a gate runner; and
    an insulator isolation trench located in a termination region that surrounds the active region, wherein the insulator isolation trench is filled with an insulator material to form an insulator termination for the semiconductor device.

2. The device of claim 1, further comprising source and body regions throughout the device.

3. The device of claim 2, wherein the source and body regions inside the active region are at source potential and the source and body regions on the outside of the insulation isolation trench are at drain potential.

4. The device of claim 1, wherein the gate runner is formed in a gate runner trench.

5. The device of claim 4, further comprising a gate contact, wherein the gate contact and the gate runner trench are located in the active region between the gate trenches.

6. The device of claim 1, further comprising a channel stop implanted at a bottom of the insulator isolation trench.

7. The device of claim 1 wherein the semiconductor device further comprises a semiconductor substrate having a heavily doped bottom layer and a less heavily doped top layer,
    wherein the insulator isolation trench reaches the heavily doped bottom layer.

8. The device of claim 1, further comprising a gate contact wherein the gate contact and portions of the gate runner are located outside a region surrounded by the insulator isolation trench.

9. The device of claim 1, wherein the insulator isolation trench borders the active area.

10. The device of claim 1, wherein a gate trench is partially merged with the insulator isolation trench.

11. The device of claim 1, wherein an extra gate runner is formed in the insulator isolation trench.

* * * * *